(12) United States Patent
Svensson et al.

(10) Patent No.: US 9,356,324 B2
(45) Date of Patent: May 31, 2016

(54) ELECTRONIC DEVICE AND METHODS THEREIN

(71) Applicant: Sony Corporation, Tokyo (JP)

(72) Inventors: Jan-Olof Svensson, Kivik (SE); Mats Wolf, Södra Sandby (SE)

(73) Assignee: Sony Corporation, Tokyo (JP)

( * ) Notice: Subject to any disclaimer, the term of this patent is extended or adjusted under 35 U.S.C. 154(b) by 186 days.

(21) Appl. No.: 14/305,170

(22) Filed: Jun. 16, 2014

(65) Prior Publication Data

US 2014/0368205 A1    Dec. 18, 2014

(51) Int. Cl.
| | |
|---|---|
| *G01N 27/416* | (2006.01) |
| *H01M 10/48* | (2006.01) |
| *G01L 1/00* | (2006.01) |
| *G01R 31/36* | (2006.01) |

(52) U.S. Cl.
CPC .................. *H01M 10/48* (2013.01); *G01L 1/00* (2013.01); *G01R 31/3606* (2013.01); *H01M 2220/30* (2013.01)

(58) Field of Classification Search
CPC ........... G01R 31/3648; G01R 31/3627; G01R 31/3662; G01R 31/3631; G01R 31/3606; Y02E 60/12; B65D 65/44; B65D 81/107; G01L 1/00; H01M 10/48; H01M 2220/30
USPC ......................................................... 324/426
See application file for complete search history.

(56) References Cited

U.S. PATENT DOCUMENTS

| | | | | | |
|---|---|---|---|---|---|
| 5,567,541 | A | * | 10/1996 | Rouhani | H01M 10/48 429/61 |
| 2003/0078743 | A1 | * | 4/2003 | Bertness | G01R 31/3627 702/63 |
| 2004/0048152 | A1 | * | 3/2004 | Yata | H01M 2/0207 429/162 |
| 2004/0247994 | A1 | * | 12/2004 | Masuda | H01M 2/345 429/66 |
| 2013/0285970 | A1 | * | 10/2013 | Ahn | G06F 3/044 345/173 |

FOREIGN PATENT DOCUMENTS

| | | |
|---|---|---|
| JP | 2002-289265 A | 10/2002 |
| JP | 2008-109742 A | 5/2008 |
| JP | 2010-032349 A | 2/2010 |
| WO | WO 02/35618 A1 | 5/2002 |

OTHER PUBLICATIONS

European Search Report Corresponding to European Patent Application No. 13 17 6832; Dated: Dec. 3, 2013; 6 Pages.

* cited by examiner

*Primary Examiner* — Arun Williams
(74) *Attorney, Agent, or Firm* — Myers Bigel & Sibley, P.A.

(57) ABSTRACT

A battery cell is configured to operate in within an electronic device. Determining the status of the battery cell includes using a strain gauge attached to the battery cell. A value of the dimension of the battery cell is established by use of the strain gauge. The status of the battery cell is determined based on the established dimension value compared to a reference value and a threshold related to the dimension of the battery cell. Related methods, devices and/or computer program products are described.

15 Claims, 3 Drawing Sheets

ELECTRONIC DEVICE AND METHODS THEREIN

CROSS-REFERENCE TO RELATED APPLICATION

This application claims priority under 35 U.S.C. §119 to European Patent Application No. 13176832.7, filed Jul. 17, 2013 in the European Intellectual Property Office, the entire contents of which are hereby incorporated by reference.

TECHNICAL FIELD

Embodiments herein relate to an electronic device and methods therein for determining status of battery cells.

BACKGROUND

Monitoring battery status is an important issue for electronic devices, such as mobile phones, computers, laptops or the like. It is important for the user of a device that reliable fuel gauge indication is provided. Further, performing and monitoring charging and discharging procedures in an accurate and correct way facilitates for the user of the device. Still further, the lifetime of a battery may be shortened if the battery is not properly charged. Although a lot of different type of batteries may be used in such devices, a common type of rechargeable batteries used in electronic devices is Li-ion and Li-polymer batteries. One aspect of batteries, which applies basically for all current Li-ion and Li-polymer battery technologies, is that they tend to change dimension upon use. Attempts have been made to utilize change of dimension to monitor batteries.

An example of a known solution is presented in US2012/0286739 A1 disclosing a system and a method for estimating a state of a battery pack. The document discloses a method for estimating the state of a battery having multiple cells. In the known arrangement, strain gauges are coupled to battery binding bands that hold a plurality of cells of the battery together. The strain measured by the gauges is related to the electrical charge stored by the battery. The known method estimates battery state of charge during conditions when battery voltage changes little and the battery continues to accept charge. Since this solution uses multiple cells external band that groups the individual cells together is required for the measurements. Further, it is not possible to detect state-of-charge for an individual cell, only the sum state-of-charge for the group of cells. Thus, poor cell condition for an individual cell can be missed.

The known document relates mainly to LFP batteries. LFP refers to Li-ion cells using Lithium Iron Phosphate ($LiFePO_4$) as active cathode material. LFP batteries has a very flat voltage profile and the flat discharge curve results in difficulty to use standard voltage-based methods for determining state-of-charge; typically high precision design is needed. In operation the cathode in a LFP battery basically gets depleted at full state-of-charge, thus voltage rises at this point. In e.g. in a LCO (Lithium Cobalt Oxide—$LiCoO_2$) battery instead approximately half is used; if more Li is taken out the cathode becomes unstable. Therefore there is a need for reliable charge control and safety electronics.

SUMMARY

An object of embodiments herein is to provide an improved way of monitoring batteries. This and other objects are achieved by a method in an electronic device for determining status of one battery cell. The battery cell is arranged to operate within the electronic device. The electronic device is arranged to comprise the battery cell. A strain gauge is attached to the battery cell. The method comprises establishing a value of the dimension of the battery cell by use of the strain gauge, determining status of the battery cell based on the established dimension value compared to a reference value and a threshold related to the dimension of the battery cell.

In another aspect, an electronic device arranged to determine status of one battery cell is provided. The battery cell is arranged to operate within the electronic device. The electronic device is arranged to comprise the battery cell. A strain gauge is arranged to be attached to the battery cell. The electronic device comprises an establishing unit configured to establish a value of the dimension of the battery cell by use of the strain gauge, a determining unit configured to determine status of the battery cell based on the established dimension value compared to a reference value and a threshold related to the dimension of the battery cell.

BRIEF DESCRIPTION OF THE DRAWINGS

Examples of embodiments herein are described in more detail with reference to attached drawings in which.

DETAILED DESCRIPTION

Embodiments herein will be exemplified in the following detailed non-limiting description.

Most of current Li-ion technologies expand upon charge and contract during discharge. This is a result from Li ions moving around in the battery cell. Further, there is also usually an expansion to some extent that is non-reversible that over time results in a gradually thicker battery. Moreover, when a battery is exposed to high temperature it also swell, the amount being a result of exact cell design decided by the manufacturer, state-of-charge, and the temperature. Modern high sensitive strain gauges are significantly improved, in particular strain gauges based on graphene. This working area is sometimes referred to as "straintronics", and enables design of devices with more than an order of magnitude higher sensitivity compared to earlier known technology.

Figure 1:
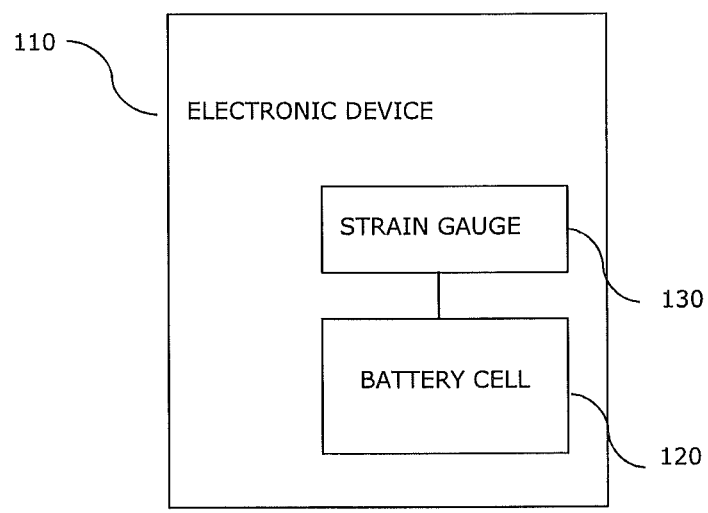
FIG. 1 a block diagram depicting embodiments herein.

FIG. 1 depicts an example of an electronic device 110 according to a first scenario in which embodiments herein may be implemented. The electronic device 110 may e.g. be a user equipment, a wireless device, a mobile terminal or a wireless terminal, a mobile phone, a computer such as e.g. a laptop, a Smartphone, a tablet computer, a surf plate, with wireless capability, or any other electronic device associated with one or more battery cells.

The electronic device 110 is arranged to comprise a battery cell 120. The battery cell 120 may be comprised in the electronic device 110 removable or fixed. The battery cell 120 may be related to any Li-ion battery. As an example, a Li-polymer or Li-ion battery of prismatic shape may be used.

A strain gauge 130 is arranged to be attached to the battery cell 120. The strain gauge may be attached outside the battery cell 120 as in FIG. 1, or inside the battery cell 120 (not shown. In some embodiments the strain gauge 130 is ultra-high sensitive, such as for example a graphene base strain gauge. By implementing the strain gauge 130 that may have ultra-high sensitivity, output from the strain gauge 130 may be used as input to for example charge and discharge control as a complement, to conventional voltage, current, and temperature readings as will be further explained below. The strain gauge 130 may be firmly attached to the surface of the battery cell 120, or may be designed as a part of a cell enclosure.

Figure 2:
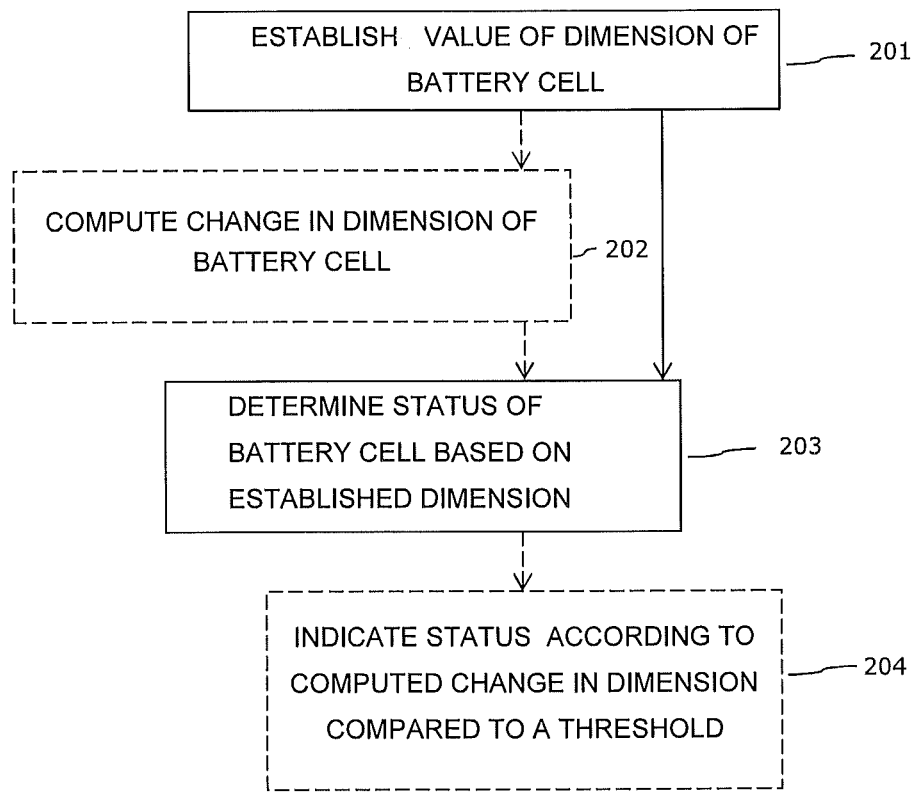
FIG. 2 is a flow chart showing embodiments herein.

Example of embodiments of a method for in an electronic device for determining status of at least one battery cell will now be described with reference to a flowchart depicted in FIG. 2.

As mentioned above, the battery cell 130 is arranged to operate within the electronic device 110. The electronic device 110 is arranged to comprise the battery cell 120. The strain gauge 130 is attached to the battery cell 120. The method comprises the following actions, which actions may be taken in any suitable order. Dashed lines of one box in FIG. 2 indicate that this action is not mandatory.

Action 201

The electronic device 110 establishes a value of the dimension of the battery cell 120 by use of the strain gauge 130. This is performed to compare to a reference value of the dimension to see any change of dimension has occurred. This will be described below. Since the strain gauge is very sensitive, an accurate value is achieved. In case the sensitivity is good enough, or if the swelling behavior of the battery cell is robust enough, it may further be used as monitoring, also traditional monitoring equipment may be replaced in total by the strain gauge.

Action 202

The electronic device 110 may in some embodiments compute a change in dimension of the battery cell 120 based on the established dimension. This may further be used to determine the status of the battery cell 120 in action 203.

In some embodiments, a threshold related to the dimension of the battery cell 120 may be defined. The computing may thus comprise computing a change in dimension of the battery cell 120 by comparing the established value with the reference value. The computed change of dimension may be used to determine the status of the battery cell 120 in action 203. For example, an initial starting point may be stored as a factory value during battery pack assembly. Thereby it is possible to track changes during transportation and identify non-preferred cell conditions.

The electronic device 110 may monitor the battery cell 120. Thus, in some embodiments, the electronic device 110 computes a change in dimension of the battery cell 120 performed per time unit. The computed change in dimension per time unit of the battery cell 120 may be basis for determining of the status of the battery cell 120 in action 203.

Action 203

The electronic device 110 determines status of the battery cell 120 based on the established dimension value compared to a reference value and a threshold related to the dimension of the battery cell 120. The determined status may be used for example for lifetime determination of the battery cell 130. Another use may be to have the determined status as part of fuel gauge input. Further, this may also prevent the electronic device 110 from being damaged due to internal pressure caused by the battery cell 130 expanding above acceptable level, causing damage to more expensive parts like a display of the electronic device 110. See more details below.

In some embodiments the change in dimension of the battery cell 120 has been computed according to action 202 based on the established dimension. In these embodiments this action of determining of the status of the battery cell 120 is further based on the computed change of dimension.

The electronic device may compute a change in dimension of the battery cell 120 per time unit as explained above. The computed change in dimension per time unit of the battery cell 120 may be basis for determining the status of the battery cell 120 in this action.

Action 204

The electronic device 110 may use the computed change in dimension compared to the threshold for indicating status of the battery cell. The indicated status may be anyone out of:
- uncharged, such as discharged, when the established dimension is below a first threshold, wherein the threshold is represented by the first threshold,
- charged when the established dimension is above a second threshold, wherein the threshold is represented by the second threshold,
- overcharged when the established dimension is above a third threshold, wherein the threshold is represented by the third threshold,
- over-discharged when the established dimension is below a fourth threshold, wherein the threshold is represented by the fourth threshold, and
- old when the established dimension is above a fifth threshold, wherein the threshold is represented by the fifth threshold.

In some embodiments, wherein the electronic device 130 has computed a change in dimension of the battery cell 120 performed per time unit, a sixth threshold related to the change of the dimension per time unit may be defined. The electronic device 110 may in these embodiments indicate status as short circuited when the change of the dimension per time unit exceeds the sixth threshold. The threshold may thus be represented by the sixth threshold. It is thus possible to use this way of monitoring and computing rapid dimensional changes to identify an external short circuit within or outside the battery cell 120. By measuring the difference in thickness per time unit, drained current may be determined. If the difference in thickness per time unit is above a predefined level such as the sixth threshold this may identify a short circuit event.

The determined status according to above may be used for example for lifetime determination of the battery cell 130, indicating that battery needs replacement. The indication may be displayed in a display of the electronic device 110 such as an indicating unit as will be described below.

Figure 3:
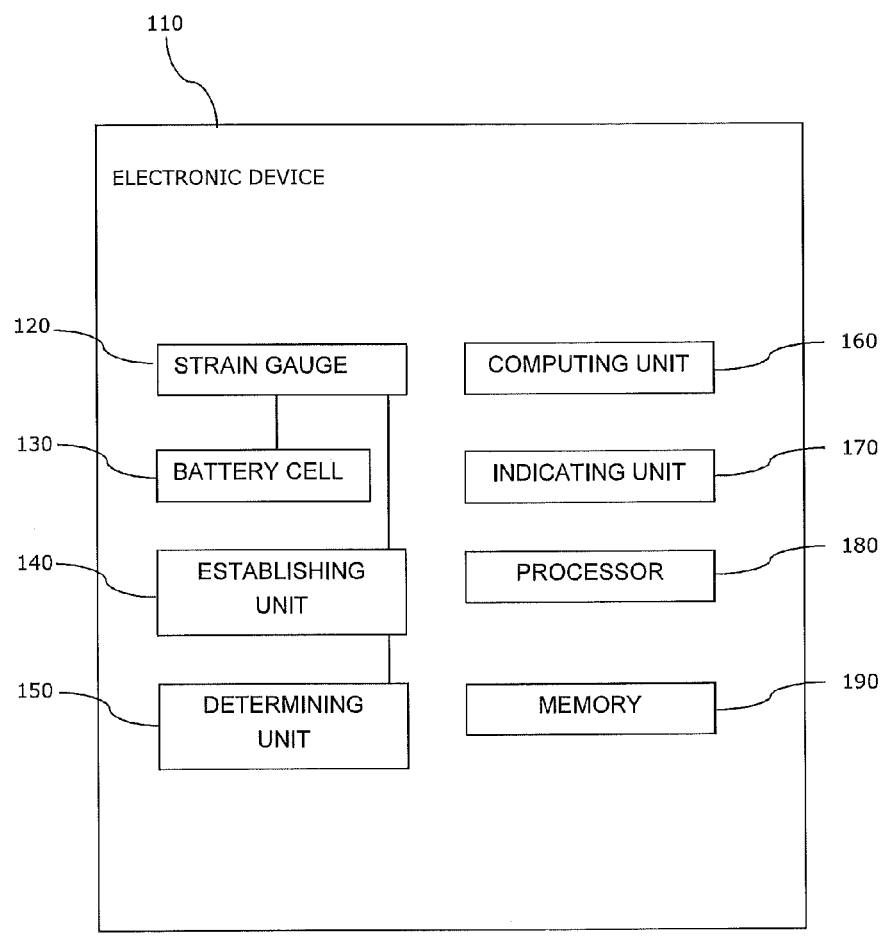
FIG. 3 is a block diagram for embodiments herein.

To perform the method actions for determining status of at least one battery cell 120 described above in relation to FIG. 2, the electronic device 110 comprises the following arrangement depicted in FIG. 3. As mentioned above the battery cell 120 is arranged to operate within the electronic device 110. The electronic device 110 is arranged to comprise the battery cell 120. A strain gauge 130 is arranged to be attached to the battery cell 120. The strain-gauge 130 may be based on graphene. Graphene is a single layer of carbon atoms arranged as a honeycomb-shaped lattice rendering it unique electrical, thermal and mechanical properties, partly due to its 2D character. The information from strain gauge might be communicated over some communication interface, for example MIPI-BIF or some other implementation.

The device 110 comprises an establishing unit 140 for establishing a value of the dimension of the battery cell 120 by use of a strain gauge 130.

The device 110 further comprises a determining unit 150 arranged to determine status of the battery cell 120 based on the established dimension value compared to a reference value and a threshold related to the dimension of the battery cell 120.

The electronic device 110 further comprises a computing unit 160 arranged to compute a change in dimension of the battery cell 120 based on the established dimension, wherein determining the status of the battery cell 120 further is based on the computed change of dimension.

In some embodiments, the threshold related to the dimension of the battery cell 120 is defined, wherein the computing unit 160 is further arranged to compute a change in dimension of the battery cell 120 by comparing the established value with the reference value, wherein the determining 203 of the status of the battery cell 120 further is based on the computed change of dimension, and wherein status is indicated according to the computed change in dimension compared to the threshold.

In these embodiments, the electronic device 110 further comprises an indicating unit 170 configured to indicate status according to the computed change in dimension compared to the threshold.

The indicated status may be anyone out of:
uncharged when the established dimension is below a first threshold, wherein the threshold is represented by the first threshold,
charged when the established dimension is below a second threshold, wherein the threshold is represented by the second threshold,
overcharged when the established dimension is below a third threshold, wherein the threshold is represented by the third threshold,
over-discharged when the established dimension is below a fourth threshold, wherein the threshold is represented by the fourth threshold, and
old when the established dimension is below a fifth threshold, wherein the threshold is represented by the fifth threshold.

In some embodiments, a sixth threshold related to the change of the dimension per time unit is defined. The indicating unit 170 further is configured to indicate status short circuited when the change of the dimension per time unit exceeds the sixth threshold, wherein the threshold is represented by the sixth threshold.

In some embodiments, the computing unit 160 is further arranged to compute a change in dimension of the battery cell 120 per time unit. In these embodiments the determining unit 150 is further configured to determine the status of the battery cell 120 based on the computed change in dimension per time unit of the battery cell 120.

The embodiments herein for a method in an electronic device for determining status of one battery cell may be implemented through one or more processors, such as a processor 180 in the electronic device 110 depicted in FIG. 3, together with computer program code for performing the functions and actions of the embodiments herein. The program code mentioned above may also be provided as a computer program product, for instance in the form of a data carrier carrying computer program code for performing methods according to embodiments herein.

The electronic device 110 may further comprise a memory 190 comprising one or more memory units. The memory 190 is arranged to be used to store obtained information, measurements, data, configurations, scheduling's, and applications to perform the methods herein when being executed in the electronic device 110.

Those skilled in the art will also appreciate that the establishing unit 140, the determining unit 150, the computing unit 160, the indicating unit 170 and the processor 180 described above may refer to a combination of analogue and digital units, and/or one or more processors configured with software and/or firmware, e.g. stored in the memory 190, that when executed by the one or more processors such as the processor 180 perform as described above. One or more of these processors, as well as the other digital hardware, may be included in a single application-specific integrated circuitry (ASIC), or several processors and various digital hardware may be distributed among several separate components, whether individually packaged or assembled into a system-on-a-chip (SoC).

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appending claims.

The invention claimed is:

1. A method in an electronic device for determining a status of one battery cell out of a plurality of battery cells, wherein the plurality of battery cells operates within the electronic device, wherein the electronic device comprises the plurality of battery cells, and wherein a strain gauge is attached to the one battery cell and generates a signal responsive to a determined change of the one battery cell sensed by the strain gauge, the method comprising:
establishing a value of a dimension of the one battery cell out of the plurality of battery cells by use of the signal generated by the strain gauge;
determining the status of the one battery cell out of the plurality of battery cells based on the value of the dimension that was established compared to a reference value and a threshold related to the dimension of the one battery cell.

2. The method according to claim 1, the method further comprising:
computing a change in dimension of the one battery cell based on the dimension that was established, wherein the determining status of the one battery cell is based on the change of dimension that was computed.

3. The method according to claim 1, wherein a threshold related to the dimension of the one battery cell is defined, wherein the computing comprises computing a change in dimension of the one battery cell by comparing the value that was established with the reference value, wherein the determining of the status of the one battery cell further is based on the computed change of dimension, the method further comprising:
indicating status based on to the change in dimension compared to the threshold.

4. The method according to claim 3, wherein the indicated status is set to one of:
uncharged when the dimension is below a first threshold, wherein the threshold is represented by the first threshold,
charged when the dimension is above a second threshold, wherein the threshold is represented by the second threshold,
overcharged when the dimension is above a third threshold, wherein the threshold is represented by the third threshold,
over-discharged when the dimension is below a fourth threshold, wherein the threshold is represented by the fourth threshold, and
old when the dimension is above a fifth threshold, wherein the threshold is represented by the fifth threshold.

5. The method according to claim 1,
wherein the computing a change in dimension of the one battery cell is performed per time unit, and wherein the determining of the status of the one battery cell is based on the change in dimension that was computer per time unit of the one battery cell.

6. The method according to claim 5,
wherein a sixth threshold related to the change of the dimension per time unit is defined,
wherein the indicating comprises indicating status short circuited when the change of the dimension per time unit exceeds the sixth threshold, and
wherein the threshold is represented by the sixth threshold.

7. An electronic device arranged to determine status of one battery cell out of a plurality of battery cells, wherein the plurality of battery cells operate within the electronic device, wherein the electronic device comprises the plurality of battery cells, and wherein a strain gauge is attached to the one battery cell and generates a signal responsive to a determined change of the one battery cell sensed by the strain gauge, the electronic device comprising:
   an establishing unit configured to establish a value of the dimension of the one battery cell out of the plurality of battery cells using the signal generated by the strain gauge;
   a determining unit configured to determine status of the one battery cell out of the plurality of battery cells based on the value of the dimension compared to a reference value and a threshold related to the dimension of the one battery cell.

8. The electronic device according to claim 7, further comprising:
   a computing unit configured to compute a change in dimension of the one battery cell based on the dimension, wherein determining the status of the one battery cell is based on the change in dimension.

9. The electronic device according to claim 8,
wherein the threshold related to the dimension of the one battery cell is defined,
wherein the computing unit is further configured to compute a change in dimension of the one battery cell by comparing the value of the dimension with the reference value,
wherein the determining unit is configured to determine the status of the one battery cell based on the change of dimension,
wherein the status is indicated according to the computed change in dimension compared to the threshold, and
wherein the electronic device further comprises an indicating unit configured to indicate status according to the change in dimension compared to the threshold.

10. The electronic device according to claim 9, wherein the indicated status is set to one of:
   uncharged when the dimension is below a first threshold, wherein the threshold is represented by the first threshold,
   charged when the dimension is above a second threshold, wherein the threshold is represented by the second threshold,
   overcharged when the dimension is above a third threshold, wherein the threshold is represented by the third threshold,
   over-discharged when the dimension is below a fourth threshold, wherein the threshold is represented by the fourth threshold, and
   old when the dimension is above a fifth threshold, wherein the threshold is represented by the fifth threshold.

11. The electronic device according to claim 7,
wherein the computing unit is arranged to compute a change in dimension of the one battery cell per time unit, and
wherein the determining unit is configured to determine the status of the one battery cell based on the computed change in dimension per time unit of the one battery cell.

12. The electronic device according to claim 11,
wherein a sixth threshold related to the change of the dimension per time unit is defined,
wherein the indicated status is set to short circuited when the change of the dimension per time unit exceeds the sixth threshold, and
wherein the threshold is represented by the sixth threshold.

13. The electronic device according to claim 7, wherein the strain gauge comprises a graphene structure extending along the one battery cell.

14. The method according to claim 1, wherein the establishing the value of the dimension of the one battery cell out of the plurality of battery cells by use of the strain gauge comprises:
   directly measuring the strain experienced by the one battery cell out of the plurality of battery cells by use of the strain gauge.

15. The electronic device according to claim 7, wherein the establishing unit establishes the value of the dimension of the one battery cell out of the plurality of battery cells based on directly measuring, using the strain gauge, the strain experienced by the one battery cell out of the plurality of battery cells.

* * * * *